United States Patent [19]

Mishiro et al.

[11] Patent Number: 4,562,413

[45] Date of Patent: Dec. 31, 1985

[54] DRIVING FREQUENCY CONTROLLING METHOD FOR AN ULTRASONIC TRANSDUCER DRIVING APPARATUS

[75] Inventors: Shoji Mishiro; Seiji Hamada, both of Kawasaki, Japan

[73] Assignee: Taga Electric Company Ltd., Tokyo, Japan

[21] Appl. No.: 503,536

[22] Filed: Jun. 13, 1983

[30] Foreign Application Priority Data

Jul. 21, 1982 [JP] Japan ................................ 57-127158

[51] Int. Cl.⁴ ................................................ H03B 5/30

[52] U.S. Cl. .................................. 331/116 R; 331/17; 310/316

[58] Field of Search ................ 310/316, 317; 366/116, 366/127; 331/17, 116 R

[56] References Cited

U.S. PATENT DOCUMENTS

| | | | |
|---|---|---|---|
| 3,843,897 | 10/1974 | Mishiro | 310/316 |
| 4,223,242 | 9/1980 | Redlich et al. | 310/316 |
| 4,275,363 | 6/1981 | Mishiro et al. | 310/316 X |
| 4,307,964 | 12/1981 | Dudgeon et al. | 366/127 |
| 4,468,581 | 8/1984 | Okada et al. | 310/316 |

*Primary Examiner*—Eugene R. Laroche
*Assistant Examiner*—Robert J. Pascal
*Attorney, Agent, or Firm*—Oblon, Fisher, Spivak, McClelland & Maier

[57] ABSTRACT

A method for flating the phase characteristic of a differential detection signal in one higher and lower regions thereof relative to its resonance frequency by controlling a differential characteristic. A searching, over a range, which is wider than the width of the flat region, is accomplished prior to phase characteristic being effected thereby discriminating a fundamental resonance frequency. After this discrimination of the fundamental resonance frequency, automatic tracking is effected under stable corrected phase characteristics for the fundamental resonant frequency whereby high electromechanical conversion efficiency can be maintained.

6 Claims, 18 Drawing Figures

Fig. 5
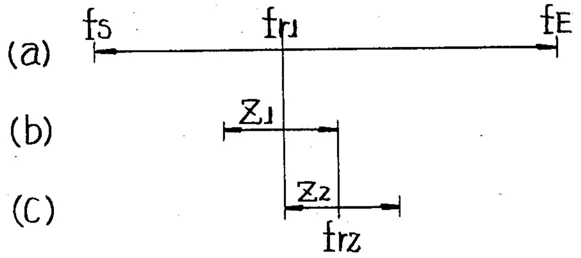
Fig. 6 (a)
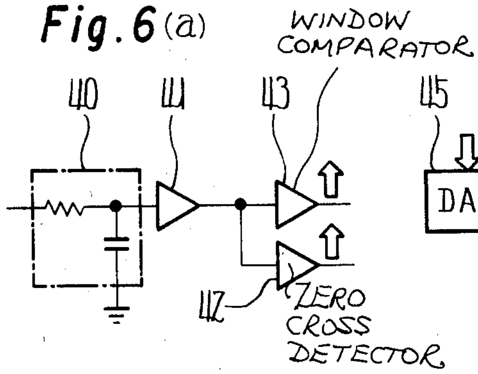
Fig. 6 (b)
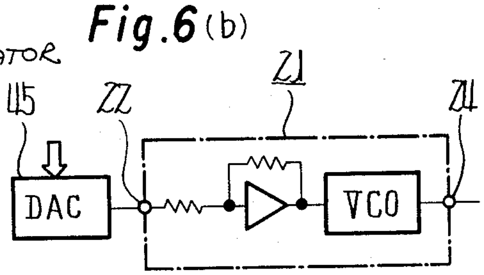
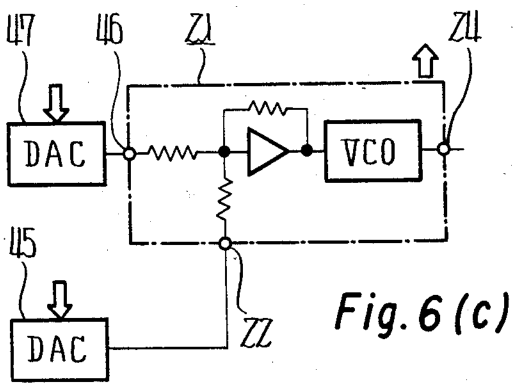
Fig. 6 (c)

DRIVING FREQUENCY CONTROLLING METHOD FOR AN ULTRASONIC TRANSDUCER DRIVING APPARATUS

FIELD OF THE INVENTION

This invention is directed to a driving frequency controlling method for ultrasonic transducer driving apparatus which can automatically follow the resonant frequency of an ultrasonic transducer to control the driving frequency thereof.

OBJECT OF THE INVENTION

An object of the present invention is to provide a method which utilizes a phase characteristic of a differential electric current. This method can completely prevent extraordinary oscillations at one of subresonance frequencies upon initiation of oscillations. This occurs due to the method involved such that at first the differential characteristic is set as shown in FIG. 2(*b*) of the attached drawings and then the oscillation frequency is swept from a lower frequency toward a higher frequency such that the frequency at the first occurred phase-inversion point is locked as a fundamental resonance point whereafter the differential characteristic is restored to such as is shown in FIG. 2(*a*) and then a PLL circuit is switchably coupled to start a driving operation with resonance tracking.

The second object of the invention is to provide a method wherein upper and lower limits of a phase detector output voltage are monitored and when the voltage is reached at one of such limits, sweeping is effected again to set a new resonance point whereafter another PLL tracking is effected again.

The third object of the invention is to provide a method wherein a tracking operation is effected after automatic determination of a perfect symmetry of a frequency-phase detection characteristic since, if there are an increased number of subresonances depending upon the construction of a vibrating system connected to an ultrasonic transducer, setting of a tap to the center of a differential transformer may not assure the symmetry of the frequency-phase detecting characteristic for the fundamental resonance frequency and sometimes the flat characteristic of the phase is shifted aside thereby to damage a tracking characteristic at a less wide one of ranges of the detecting characteristic.

DESCRIPTION OF THE DRAWINGS

FIG. 1(*b*) is a diagram of an equivalent circuit of the transducer circuit of FIG. 1(*a*);

FIG. 1(*c*) is a vector diagram of the equivalent circuit;

FIG. 1(*d*) is a diagram illustrating a relationship in phase of the detected voltage;

FIG. 3(*b*) is a diagram showing a waveform of vibrations at an end face of the ultrasonic transducer of FIG. 3(*a*);

FIG. 3(*c*) is a perspective view of another typical ultrasonic transducer of a different configuration;

FIGS. 5(*a*), 5(*b*) and 5(*c*) are diagrams illustrating a sweep range and PLL tracking ranges, respectively;

FIGS. 6(*a*), 6(*b*) and 6(*c*) are diagrams each showing a driving circuit in a modified form.

DESCRIPTION OF THE PRIOR ART

Ultrasonic transducers are commonly driven at a fundamental resonant frequency at which the electromechanical conversion efficiency is the highest. The resonant characteristic of an ultrasonic transducer presents a high Q such that a small shift in the driving frequency from the resonant frequency will cause a remarkable reduction of the vibration producing efficiency. Accordingly, automatic tracking apparatuses which automatically track the resonant frequency of a transducer to drive the transducer into oscillation, (i.e., a vibration feedback type oscillator and a PLL (phase locked loop) type oscillator) are widely used.

Indeed up to one wave length or so of the resonant length of a mechanical vibration system including an ultrasonic transducer, a horn, and a tool or the like will not cause a very serious problem, however if the resonance length is increased, the system will present several subresonant points around its fundamental resonant frequency and upon initiation of oscillation or upon rapid fractuation load, the transducer may sometimes be brought into oscillation at one of the subresonant points. This will significantly deteriorate the reliability of the ultrasonic generating apparatus.

In order to eliminate such defects, it is recommended to set the tracking range of an automatic tracking circuit as narrowly as possible. However, there is an antinomic problem such that it is desirable to set the tracking range as broad as possible from a point of view of compatibility when there exists a necessity of exchanging of horns, tools, or the like, and width of resonance point variations, deviation in mass production of the transducers, and so on, are taken into consideration.

Figure 1:
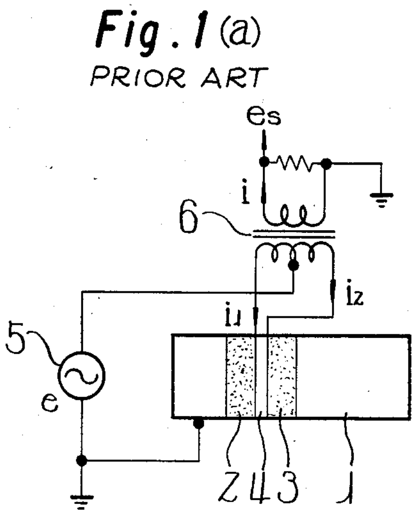
Fig. 1 (a) PRIOR ART
FIG. 1(*a*) is a diagram of a prior art circuit for detecting a vibration velocity signal.
Figure 1:
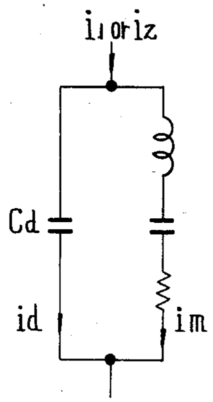
Figure 1:
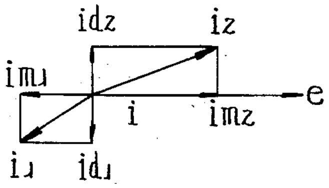
Figure 1:
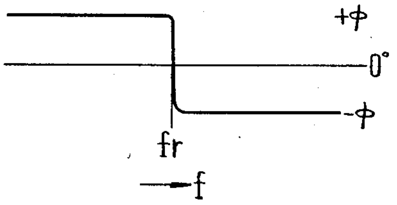

Various systems have been proposed and brought into practice for automatic resonance point tracking circuits. One of these tracking circuits will be described in the following. Referring to FIG. 1(*a*), an ultrasonic transducer 1 has a resonance frequency such that it vibrates in a ½ wave length along an axis thereof. Electrostrictive elements 2 and 3 are securely fastened to portions of the ultrasonic transducer 1 where the stress of resonance vibrations are different from each other by means of a center bolt (not shown) or the like with an insulator 4 clamped therebetween.

Opposite ends of a primary coil of a differential transformer 6 are connected to electrodes of opposing faces of the electrostrictive elements 2 and 3, while a center-tap is connected to a high voltage side terminal of a driving power source 5. Electrodes on the respective opposite faces of the electrostrictive elements 2 and 3 are connected to a body of the ultrasonic transducer 1 which is then connected to a ground side terminal of the driving power source 5. When the ultrasonic transducer 1 is driven at a resonance frequency, electric currents $i_1$ and $i_2$ flowing through the electrostrictive elements 2 and 3 which are determined as vector products of a dynamic current $i_m$ with a damping current $i_d$ which flows into a damping capacitor as shown in FIG. 1(*b*), in accordance with the distribution of their respective stresses.

The current $i_m$ is a dynamic current which is proportional to the velocity of mechanical vibrations, and it is desired to extract the components effectively. Therefore, if a current of a difference between the currents $i_1$ and $i_2$ which flows through the electrostrictive elements 2 and 3 is taken from a secondary coil of the differential transformer 6, a signal proportional to a difference between their individual dynamic currents, (i.e., a vibration velocity detection signal $e_s$,) is obtained since their individual damping currents are equal to each other and therefore offset or cancel each other. This relationship is illustrated in FIG. 1(c).

This detection signal $e_s$ is fed back to an input of the oscillator or is controlled in phase by a phase locked loop circuit in order to effect automatic tracking of the resonance frequency.

As shown in FIG. 1(d), the frequency characteristic of the detection signal Cs relative to the driving voltage in phase is 0 degrees at the resonance frequency $f_r$ and leads at a lower frequency while it lags at a higher frequency. As shown in FIG. 1(d), the phase detection signal is flattened at a settled phase shift level both in the advanced and delayed phases by a limiter, and the higher the Q of the resonance of the ultrasonic transducer 1 is, the sharper the varying rate of the phase adjacent the resonance frequency becomes. Further, width of frequency which is flat and is in phase can be detected extends over 2 to 3 kHz in general.

However, as a vibrator connected to the ultrasonic transducer 1 becomes longer than one wave length, (i.e. at $1+\frac{1}{2}$ wave length or so) the number of subresonance frequencies increases and as well a number of subresonances appear around the fundamental resonance frequency. This tendency is more remarkable where a step horn or a member of a special configuration is connected to the mechanical vibrating system.

Figure 3:
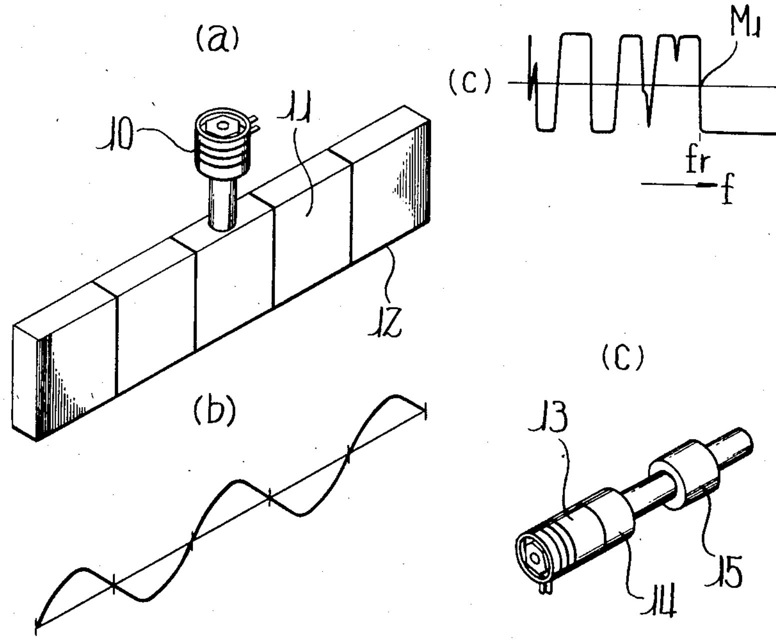
FIG. 3(*a*) is a perspective view of a typical ultrasonic transducer.

Examples of such configurations are illustrated in FIG. 3. Referring to FIG. 3(a), a wide vibrating member 11 which is designed to resonate at a $\frac{1}{2}$ wave length in an axial direction and at a $2+\frac{1}{2}$ wave length in a widthwise direction is connected to an end of a step horn type transducer 10. Distribution of the axial amplitude at the end 12 of the wide vibrating member 11 presents a distribution of a $2+\frac{1}{2}$ wave length in the widthwise direction as shown in FIG. 3(b). Referring now to FIG. 3(c), a step horn 14 and another step horn 15 are mechanically connected in series to an ultrasonic transducer 13 which resonate at a $1+\frac{1}{2}$ wave length in the axial direction.

An example of characteristics of such a phase detection signal is illustrated in FIG. 2(a). As seen from FIG. 2(a), a number of subresonance points at which the phase zero line is crossed appear in higher and lower frequency bands around and adjacent the fundamental resonance frequency $f_r$. If appearance of such subresonance points becomes more remarkable, oscillation will often shift to one of such subresonance points under an oscillating starting, rapidly fluctuating load or heavy load.

Accordingly, in the primary coil of the differential transformer 6 as shown in FIG. 1(a), the centertap is provided in the center thereof in order to offset damping currents of individual sections thereof which are currents of the same amplitude and obtain a current proportional to dynamic currents as a vibration velocity detection signal $e_s$. In this apparatus, if the position of the centertap of the differential transformer 6 is changed an unbalanced condition in which damping currents of the electrostrictive elements 2 and 3 do not completely offset each other, either a phase detection waveform wherein the phase advances in the lower frequency region to present a flat condition while many subresonances appear in the higher frequency region relative to the fundamental resonance freqency $f_r$ or a reverse phase detection waveform is obtained in accordance with the tendancy of the difference between the damping currents, as seen in FIGS. 2(b) and 2(c) respectively.

DESCRIPTION OF THE PREFERRED EMBODIMENTS

Figure 4:
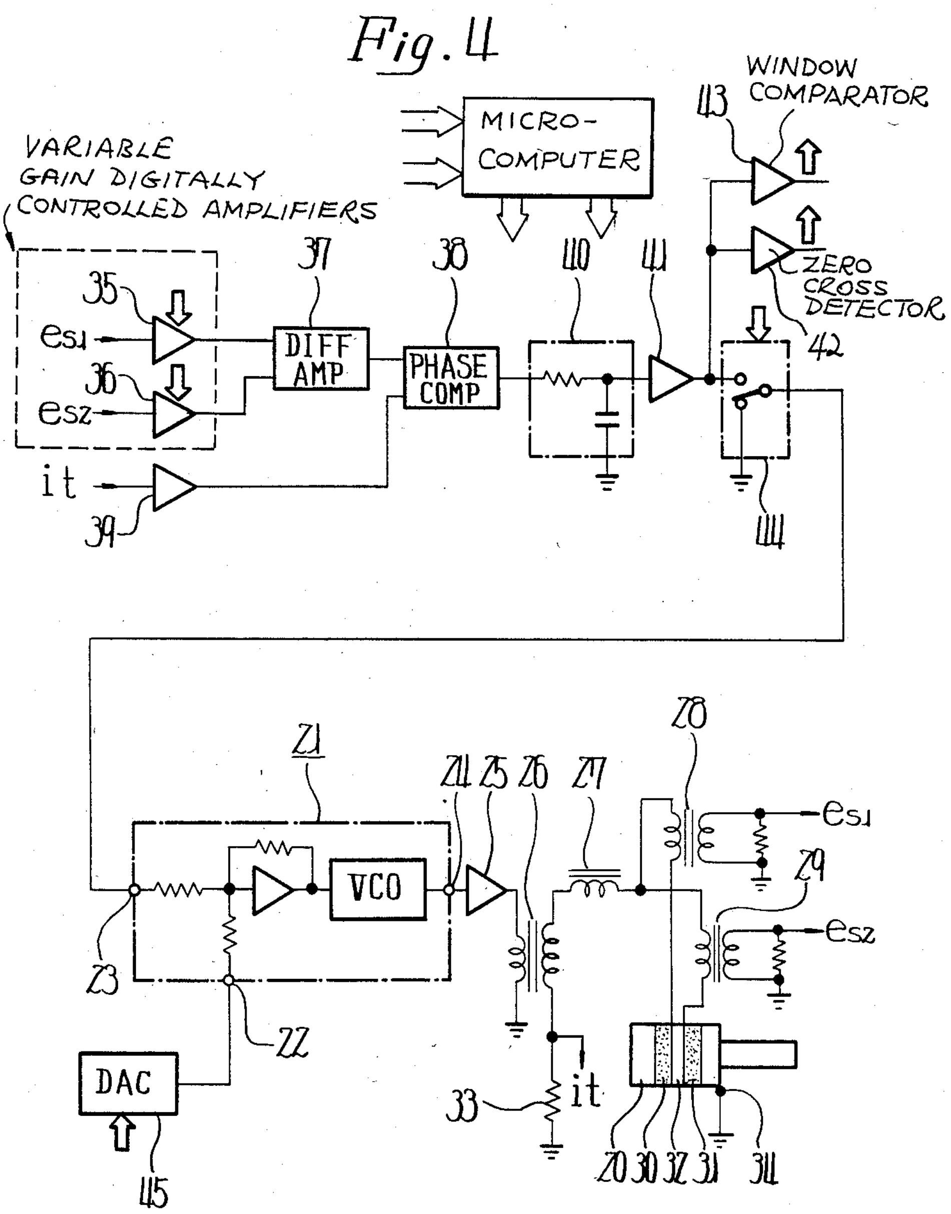
FIG. 4 is a diagram of a driving circuit according to the present invention.

In the following, the preferred embodiments of the present invention will be described in detail with reference to FIGS. 4 to 7. Referring first to FIG. 4, a voltage controlled oscillator 21, for determining the driving frequency of an ultrasonic transducer 20, has a sweep input terminal 22 and a PLL input terminal 23. Outputs are provided for frequency controlled voltage by a voltage applied to the input terminals 22 and 23 from (an output) the terminal 24. The output voltage is inputted to an amplifier 25 which power amplifies the signal. The amplified voltage is applied to a primary coil of an output transformer 26 which provides from a secondary coil thereof a transformed voltage which is coupled to electrostrictive elements 30 and 31 of the ultrasonic transducer 20 through a series inductor 27 and primary coils of current detecting transformers 28 and 29, respectively. Meanwhile, the opposite end of the secondary coil of the output transformer 26 is connected to a ground side terminal 34 of the ultrasonic transducer 20 through a resistor 33 which detects a current flowing through the ultrasonic transducer 20.

Since the ultrasonic transducer 20 has an insulator plate 32 interposed between opposing electrodes of the electrostrictive elements 30 and 31, voltages $e_{s1}$ and $e_{s2}$ at the secondary sides of the current detecting transformers 28 and 29 have values proportional to electric currents flowing into the electrostrictive elements 30 and 31, respectively. Though not shown in FIG. 4, a vibrating system, is also provided which is connected to the ultrasonic transducer 20 which may be, for example, such as is shown in FIG. 3(a) or 3(c).

These current detection signals $e_{s1}$ and $e_{s2}$ are inputted to and amplified by digitally controlled amplifiers 35 and 36 under controlled voltage gain, respectively, and are then applied to a differential amplifier 37 which provides a signal voltage proportional to a difference of the applied voltages. The output signal from the differential amplifier 37 is coupled to a phase comparator 38 as one of its inputs.

In one of the embodiments, the system control is provided by a microcomputer and, in FIG. 4, control inputs and outputs to and from the same are represented by widened arrow marks wherein directions of flows of data are individually represented by directions of the individual arrow marks.

Figure 2:
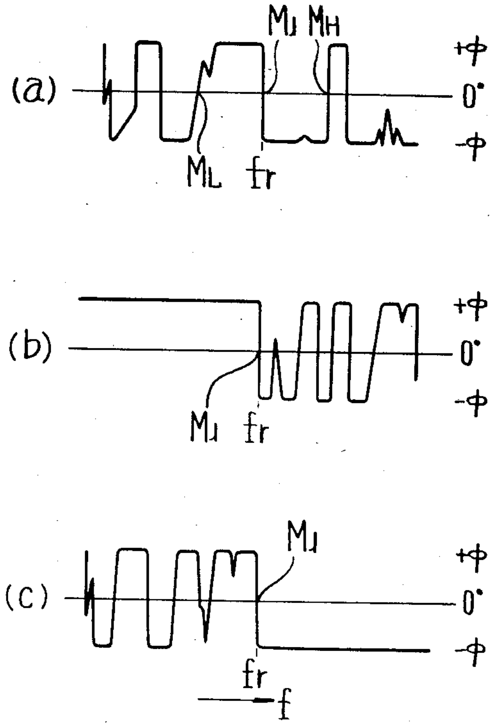
FIGS. 2(*a*), 2(*b*) and 2(*c*) are similar diagrams each illustrating a characteristic of a phase detection signal.

The voltage gain of the digitally controlled amplifiers 35 and 36 can be individually set in accordance with an instruction from the microcomputer. Therefore, if the voltage gain is set, for example, 1:1, the output voltage of the differential amplifier 37 will become an output, that is, a vibration velocity signal is outputted which is proportional to a difference of currents flowing through the electrostrictive elements 30 and 31 of the ultrasonic transducer 20. A phase characteristic of the phase detection signal in this case will be as shown in FIG. 2(*a*). An electric current flowing through the ultrasonic transducer 20 causes a voltage drop to appear across the resistor 33 which is coupled to the other input terminal of the phase comparator 38 as a signal $i_t$ through an amplifier 39. The phase comparator 38 compares the differential detection signal and the transducer current (with each other) to provide a phase difference signal which is integrated at the integrator 40 and is coupled through the DC amplifier 41 to the zero cross detector 42, a window comparator 43 and the make contact of the switch 44. A break contact of the switch 44 is grounded while a common terminal is connected to the PLL input terminal 23 of the voltage controlled oscillator 21. A digital to analogue converter 45 is connected to the sweep input terminal 22 of the voltage controlled oscillator 21.

The operations of the apparatus of FIG. 4 are as follows. First, the digitally controlled amplifiers 35 and 36 are set under control of the microcomputer to have different voltage gains so as to provide a phase characteristic as shown in FIG. 2(*b*) where the phase advances is flat at a lower frequency area than the resonance frequency. Such set values are preloaded in a memory.

Subsequently, also under control of the microcomputer, the output voltage of the digital to analogue converter 45 is increased from zero as the time passes to cause the output 24 of the voltage controlled oscillator 21 to sweep from a low to a high frequency.

Concurrently the microcomputer monitors the output of the zero cross detector 42 and, when the phase detection voltage crosses zero, it stops the sweeping operation of the digital to analogue converter 45 and stores a digital output value M1 of the converter 45 at that instant. The digital value M1 will be a preset value of the fundamental resonance frequency (refer to FIG. 2(*b*)).

Subsequently, the voltage gain of the digitally controlled amplifiers 35 and 36 is set to 1:1 by the microcomputer such that the phase detection characteristic is as represented in FIG. 2(*a*). Then, the switch 44 is operated into the position to which transfers the frequency control of the voltage controlled oscillator 21 to the PLL side whereafter monitoring by the microcomputer is changed over from the zero cross detector 42 to the window comparator 43 so as to effect tracking of a resonance of the ultrasonic transducer 20 by the PLL, and driving of the transducer 20 is started.

The sweep frequency and tracking ranges in this case are illustrated in FIG. 5. Referring to FIG. 5(*a*) which illustrates a range of such sweep, the sweep is started from a frequency $f_s$ and is locked at another frequency $f_{r1}$ to set the M1. Thereafter, while monitoring the output of the window comparator 43, whithin a range Z1 around the point M1, as shown in FIG. 5(*b*), the driving of the ultrasonic transducer 20 is continued along with tracking the resonance frequency of the ultrasonic transducer 20. If the resonance frequency is shifted higher out of the range Z1, then the output of the window comparator 43 will present a change. As a result, the microcomputer which monitors this immediately causes oscillation to be stopped and another sweeping operations is initiated again to search for a new resonance frequency. Thus, the frequency is locked at $f_{r2}$ of FIG. 5(*c*) such that PLL tracking may be effected within the range Z2 around the frequency $f_{r2}$.

In the followings, a further improved method will be described. The phase detection characteristic regularly presents a substantially symmetrical range around the fundamental resonance frequency $f_r$ until zero crosses are presented, as shown in FIG. 2(*a*), however depending upon construction of the ultrasonic transducer 20 and a vibrating member (not shown) connected to the ultrasonic transducer 20, dissymmetrical phase reversing portions may appear which will extremely narrow the stable tracking range. These portions will considerably vary by the intensity of subresonances, the Q, the differential accuracy, or the like.

Accordingly, in the embodiment shown in FIG. 4, after determination of the fundamental frequency to M1 by sweeping of the digital to analogue converter 45, the digitally controlled amplifiers 35 and 36 are controlled to present a ratio of 1:1 between their voltage gain, and the digital to analogue converter 45 is controlled to sweep from the resonance frequency M1 to a lower frequency until a falling edge is detected by the zero cross detector 42. The sweeping is then stopped and a digital value is stored into the memory as the ML.

Then, the digital to analogue converter 45 is caused to sweep from the M1 to a higher frequency until a rising edge is detected by the zero cross detector 42. Thereupon, the sweeping is stopped and a value at this instant is stored into the memory as an MH.

As a result, the phase detection characteristic becomes symmetrical by this type of control. The frequency control of the voltage controlled oscillator 21 is then changed over to the PLL side and the apparatus will thereafter operate in a similar manner. By this sequence of operations, the phase detection characteristic during PLL operations is always held under best conditions. As a result, a more reliable operation is attained, along with maintaining or achieving compatibility of the vibrating system including an ultrasonic transducer. further improved), this allows the exchanging of tools.

A still further improved method will be described in the followings with reference to FIGS. 6(*a*) and 6(*b*). An object of the method resides in attainment of detection of a fundamental frequency and of PLL tracking operation with a computer. Referring to FIGS. 6(*a*) and 6(*b*), the apparatus is different from that of FIG. 4 in that the switch 44 and the PLL input terminal 23 of the oscillator are omitted. And, a preset value of the window comparator 43 is preferably made smaller than that of the case of FIG. 4.

Difference of operations of the apparatus from those of the apparatus of FIG. 4 begin with an initiation of PLL tracking. Monitoring of the computer is changed over to the window comparator 43, and if a change of the output of the window comparator 43 is taken into the microcomputer, then the preset value of the digital to analogue converter 45 is changed by one digit from M1 to effect a controlling operation in a direction to return the output of the window comparator 43 to its initial output condition, that is, in a direction to reduce the phase detection output to a zero degree. If there is a large variation in the resonance frequency, then the output of the DC amplifier 41 will be restored to the preset value of the window comparator 43 by several steps of such control sequences. By these operations, the voltage controlled oscillator 21 automatically tracks the resonance frequency of the ultrasonic transducer 20 under control of the computer thereby to effect stabilized driving of the ultrasonic transducer 20.

Here, a PLL tracking range is predetermined and stored in the memory, and if M1 is found out by sweeping, it is calculated and determined by the computer and when it is reached at a boundary of the range, another sweeping operation is effected to search for a new resonance point.

However, a problem left unsolved is stability of the frequency of the voltage controlled oscillator itself relative to temperature. Normally, such stability does not matter because, when the frequency of oscillations of the voltage controlled oscillator varies by temperature, the PLL tracking operations will advance in a direction to compensate for such variation of the frequency. However, in such a case as there are a number of subresonance frequencies and hence a PLL tracking range is set relatively narrow, such a tracking range will be exceeded by a temperature drift of the voltage controlled oscillator itself. As a result, an operation for re-detecting a resonance point by sweeping may have to be frequently effected, causing an interruption of an ultrasonic processing operation, causes inconvenience in some applications.

Moreover, the frequencies at starting and ending points of sweeping preceding to processing operations are also varied with such a temperature drift thereby to change a range of the sweeping frequency, and searching of the fundamental resonance frequency may sometimes be rendered impossible. In such a case, the necessity will arise for an apparatus having a voltage controlled oscillator which presents a high temperature stability, which will increase, a demerit in cost.

An embodiment of means which is further improved to resolve such problems as described above is partially illustrated in FIG. 6(*c*). Referring to FIG. 6(*c*), the voltage controlled oscillator 21 has a pair of control input terminals 22 and 46. The input terminal 22 is used for two functions including a sweep locking operation and a PLL tracking operation similarly to that as shown in FIG. 6(*b*). Meanwhile, the other input terminal 46 is additionally used for an improved drift compensating function and an output of another digital to analogue converter 47 is connected thereto.

Referring to FIG. 6(*c*), the functions of the digital to analogue converter 47 will be described while operations of the digital to analogue converter 45 are omitted as it functions in a similar manner to that of FIG. 6(*b*). After the digital to analogue converter 47 is set to its central value by a computer, the oscillation frequency of the voltage controlled oscillator 21 is counted by the computer. Then the digital preset value is at a starting point of sweeping, by the digital to analogue converter 45 it is set to zero at initiation of such sweeping. If there is an error in the count relative to a prescribed value, the preset value of the digital to analogue converter 47 will be corrected by the number corresponding to the error to compensate for a frequency drift at the starting point.

Further, during an ultrasonic oscillating operation for PLL tracking, by the digital to analogue converter 45, the microcomputer is interrupted after each period of time to measure an oscillation frequency of the voltage controlled oscillator 21 in order to calculate a deviation of the thus measured oscillation frequency from a predetermined frequency depending upon the preset value of the digital to analogue converter 45 at that instant and also to calculate the number of steps required to effect an appropriate correction at the digital to analogue converter 47 thereby to effect a drift compensation during running of the apparatus.

During these compensating operations, the digital to analogue converter 47 is shifted the required number of steps while controlling the PLL tracking for each correcting operation of the digital to analogue converter 47 by one digit such that there exists no rapid variation of the oscillation frequency. It is to be noted that, while description has been given that the digital to analogue converter 47 is provided independently of the digital to analogue converter 45, the digital to analogue converter 45 may additionally involve the functions of the digital to analogue converter 47.

Figure 7:
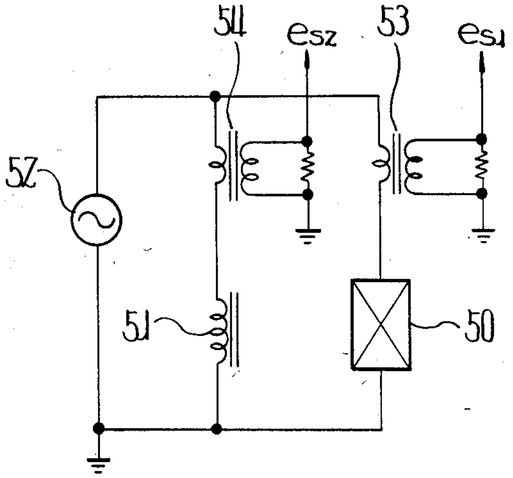
FIG. 7 is a circuit diagram showing a modified form of a detecting circuit.

It is further to be noted that, while a method of detecting a vibrating velocity signal has been described in the embodiments which are principally based on the construction as shown in FIG. 1, many other methods may also be employed. For example, an apparatus as shown in FIG. 7 can be used to detect a vibrating velocity signal. Referring to FIG. 7, an ultrasonic transducer 50 and a compensating inductor 51 are connected in parallel with a driving power source 52. Current transformers 53 and 54 are connected to detect electric currents flowing through the ultrasonic transducer 50 and the compensating inductor 51, respectively, and provide output voltages $e_{s1}$ and $e_{s2}$. Thus, an output representing a difference between the voltages $e_{s1}$ and $e_{s2}$ may be appropriately used as a vibration velocity detection signal.

Further, while searching of a fundamental resonance frequency by frequency sweeping has been described by sweeping from a low to a high frequency, this only indicates a desirable sweeping direction, and sweeping in the opposite direction from a high to a low frequency may also be available by setting the phase detection characteristic as shown in FIG. 2(*c*).

Moreover, since an electric current flowing through an ultrasonic transducer upon sweeping varies widely depending upon the resonance characteristic thereof and sometimes an excessive electric current may flow therethrough, more preferably the voltage of the power source at the power amplifying stage may be lowered. Additionally a current limiter or some other means may be provided.

As apparent from the foregoing detailed description, the present invention resides in provision of means which eliminates and improves defects of an automatic resonance point tracking system which have been considered impossible to resolve in a a vibrating system, and especially when the vibrating system includes an ultrasonic transducer therein, and the system drives a member which has a number of subresonances around a fundamental resonance frequency. Thus, by such a construction as described above, an ultrasonic transducer driving apparatus, wherein damping components of driving voltages or currents of the transducer are offset by a differentiating circuit to take out dynamic components as vibration velocity signals, which are used either as a feedback signal to a feedback oscillator for automatic resonance point tracking or as a phase signal for PLL control, a fundamental resonance frequency can be easily discriminated by sweeping, after which the frequency-phase characteristic of a vibration velocity signal can be detected by suitably controlling a differentiating ratio at a differentiating circuit. This ratio is made flat either in a higher or lower region thereof relative to a resonance frequency, by a voltage controlled oscillator from the flat region toward the resonance frequency. Further, since a PLL tracking operation is effected around the fundamental resonance frequency while the symmetricalness of the width of the higher or lower flat portion of the phase characteristic when the differential characteristics is set to the center is controlled in accordance with a ratio of differentiation depending upon results of calculations with a microcomputer to correct the same, unstable operations such as skipping of the resonance frequency to one of subresonance frequencies during operation of the apparatus can be eliminated. Moreover, since a frequency drift due to a temperature rise of the voltage controlled oscillator itself can be self-corrected by a correcting digital to analogue converter after lapse of each period of time, a highly stabilized driving apparatus can be obtained at a reduced cost. As a result, the frequency tracking range when a horn or a tool which constitutes part of a mechanical vibrating system is exchanged is allowed to become wider facilitating a resonance point tracking operation even in a very complicated resonance system without any restriction of the geometry and resonance frequency of the vibrating system. This methodology improves the number of degrees of freedom. Thus, the method of the present invention have various advantages and effects as described above.

What is claimed is:

1. In a driving frequency controlling method for an ultrasonic transducer driving apparatus of the type wherein by differential detection equal damping current components are offset from and cancel each other while the difference between voltages proportional to dynamic current components produces a vibration velocity signal which is used as a frequency controlling signal for effecting the locking feature of PLL tracking, the improvement wherein one of higher and lower ranges of a phase characteristic of a transducer resonant frequency is made flat by controlling the proportionality characteristic of the voltages whereafter the frequency of a voltage controlled oscillator is swept through one of said flat ranges toward a resonant frequency to determine the fundamental resonant frequency.

2. In a driving frequency controlling method for an ultrasonic transducer driving apparatus of the type wherein by differential detection equal damping current components are offset from and cancel each other and while the difference between voltage proportional to dynamic current components produces a vibration velocity signal which is used as a frequency controlling signal for effecting the locking function PLL tracking, the improvement wherein one of higher and lower ranges of a phase characteristic of a differential detection signal relative to a resonant frequency is made flat by controlling the differential characteristic whereafter the frequency of a voltage controlled oscillator is swept from the flat region toward a resonant frequency to discriminate a fundamental resonant frequency, and then the flat frequency widths of the higher and lower ranges of the phase characteristic when the differential characteristic of a differential detecting circuit is balanced so as to be detected in order to correct the differential characteristics thereof in accordance with values obtained by said detection thereby causing the frequency widths of the flat ranges to be symmetrical with each other.

3. In a driving frequency controlling method for an ultrasonic transducer driving apparatus of the type wherein by differential detection equal damping current components are offset from and cancel each other and while the difference between voltages proportional to dynamic current produces a vibration velocity signal which is used as a frequency controlling signal for effecting the locking function of a PLL tracking, the improvement wherein one of higher and lower ranges of a phase characteristic of a differential detection signal relative to a resonant frequency is made flat by controlling the differential characteristic whereafter the frequency of a voltage controlled oscillator is swept from the flat region toward a resonant frequency to discriminate a fundamental resonant frequency, and a measuring operation of the frequency of said voltage controlled oscillator upon initiation of sweeping and after each lapse of a fixed period of time during PLL tracking as well as an operation for self-compensation of a frequency drift of said voltage controlled oscillator by an oscillation frequency controlling DA converter are effected.

4. A driving frequency control method for an ultrasonic transducer driving apparatus of the type wherein, by differential detection damping equal current components are offset from and cancel each other and while the difference between voltage proportional to dynamic current components produce a vibration velocity signal which is used as a frequency controlling signal effecting the locking function PLL tracking comprising the steps of:

making flat one of higher and lower ranges of a phase characteristic of a differential detection signal relative to a resonant frequency by controlling the differential characteristics; and sweeping the frequency of a voltage controlled oscillator from the flat region toward a resonance frequency thereby discriminating a fundamental resonance frequency.

5. A driving frequency control method for an ultrasonic transducer driving apparatus of the type wherein, by differential detection damping equal current components are offset from and cancel each other and while the difference between voltage proportional to dynamic current components produce a vibration velocity signal which is used as a frequency controlling signal effecting the locking function of a PLL tracking, comprising the steps of:

making flat one of higher and lower ranges of a phase characteristic of a differential detection signal relative to a resonant frequency by controlling the differential characteristics;

sweeping the frequency of a voltage controlled oscillator from the flat region toward a resonant frequency thereby discriminating a fundamental resonance frequency;

detecting the flat frequency width of the higher and lower ranges of the phase characteristic when the phase characteristics of a differential detecting circuit is perfectly balanced; and correcting the differential characteristics when the phase characteristics of a differential detection circuit is perfectly balanced; and correcting the differential characteristics in accordance with values obtained by said detecting step thereby making the frequency widths of the flat ranges symmetrical to each other.

6. A driving frequency control method for an ultrasonic transducer driving apparatus of the type wherein, by differential detection damping equal current components are offset from and cancel each other and while the difference between voltage proportional to dynamic current components produce a vibration velocity signal which is used as a frequency controlling signal effecting the locking function of a PLL tracking, comprising the steps of:

making flat one of higher and lower ranges of a phase characteristic of a differential detection signal relative to a resonant frequency by controlling the differential characteristics;

sweeping the frequency of a voltage controlled oscillator from the flat region toward a resonant frequency thereby discriminating a fundamental resonance frequency;

measuring the frequency of said voltage controlled oscillator upon initiation of sweeping and after each lapse of a predetermined fixed period of time during PLL tracking; and self-compensating any frequency drift of said voltage controlled oscillator by an oscillation frequency controlling DA converter.

* * * * *